Figure 1:
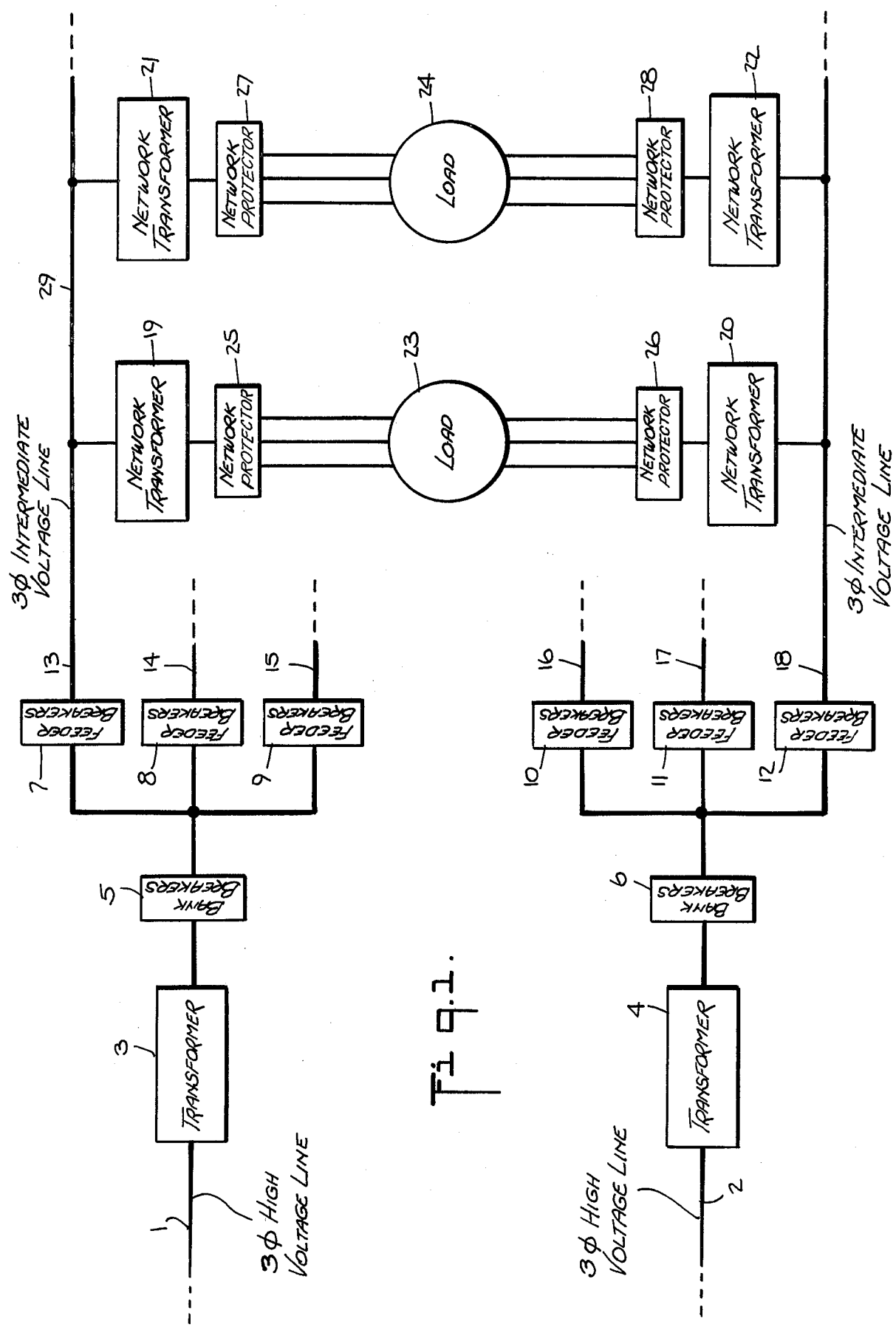

United States Patent [19]

Scaturro

[11] 4,096,539
[45] Jun. 20, 1978

[54] DETECTOR OF BACKFEED ELECTRICAL CURRENTS

[76] Inventor: Angelo J. Scaturro, 6437 79th St., Middle Village, N.Y. 11379

[21] Appl. No.: 719,131

[22] Filed: Aug. 31, 1976

[51] Int. Cl.² .............................................. H02H 3/08
[52] U.S. Cl. ........................................ 361/93; 324/51; 361/54; 361/87
[58] Field of Search ....................... 361/54, 55, 57, 47, 361/84, 82, 87, 93; 324/51, 52, 107, 133; 340/254, 255, 256; 307/51, 61, 69

[56] References Cited

U.S. PATENT DOCUMENTS

| | | | |
|---|---|---|---|
| 2,672,584 | 3/1954 | Rolf | 361/57 X |
| 3,416,074 | 12/1968 | Schoonover | 324/133 X |
| 3,633,071 | 1/1972 | Fendt et al. | 340/253 N |

Primary Examiner—Patrick R. Salce
Attorney, Agent, or Firm—Brooks Haidt Haffner & Delahunty

[57] ABSTRACT

Apparatus for detecting current flow in any one or more of the three lines of a three phase electrical system which have been connected together by means having negligible impedance which comprises three current transformers which may be magnetically coupled to the lines and a further transformer for combining the outputs of the current transformers. The further transformer is connected to an amplifier and a rectifier and the rectified voltage is used to control a visual and audible alarm system to indicate the presence of current flow in one or more of the lines. The rectified voltage may also be used to prevent re-opening of a switch which is used to interconnect the lines.

13 Claims, 2 Drawing Figures

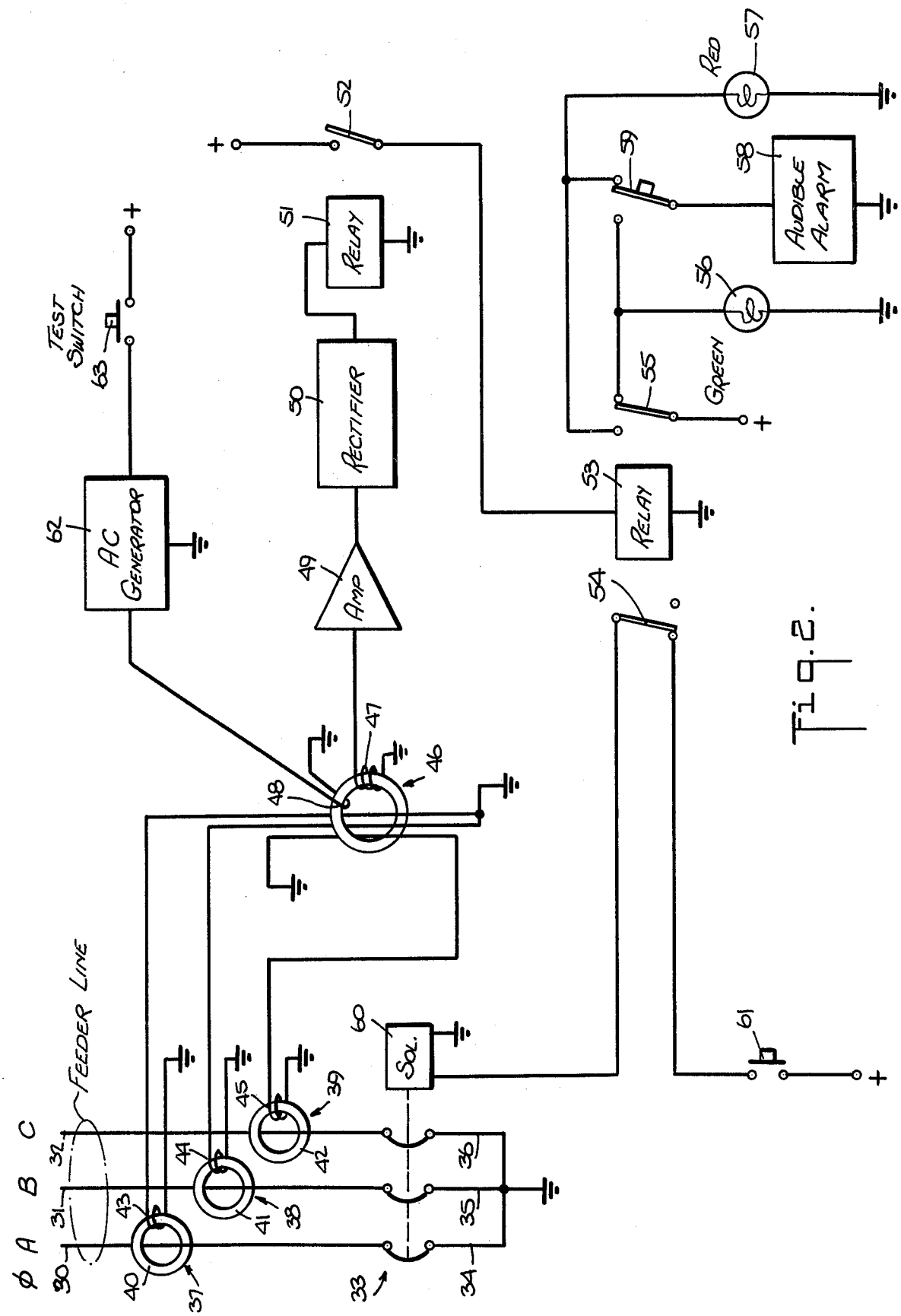

DETECTOR OF BACKFEED ELECTRICAL CURRENTS

This invention relates to apparatus for detecting backfeed currents in high voltage feeder lines when such lines have been intentionally interconnected at a substation prior to test or repair purposes.

Electrical distribution systems are well-known in the art and generally include very high voltage, three phase lines which are connected to substations through transformers and circuit breakers, and the substations are connected to the final loads through other transformers and network protectors. Normally, the substation lines may be de-energized by tripping of the appropriate breakers, either manually or because of faults, but it sometimes happens that a network protector fails to open when a fault occurs. Also, several substations may be connected to a common load so that, even though the outgoing substation lines may be disconnected from the incoming lines, there may be backfeed to an outgoing line or lines due to the connection thereof to a common load and a faulty network protector which connects the outgoing lines to a common load.

It has been the practice in at least one electrical utility system to provide a so-called "ground and test" device for connection to the three phase feeder lines at a substation when it is desired to work on such feeder lines for test or repair purposes. Such lines may normally be at a voltage of approximately 13 kilovolts, and it is necessary to make certain that they are not "live" when an operator is working on them. Such ground and test device includes a three-pole switch with means for connecting the open side of the switch to the lines, the other side of the switch being connected to a common point on ground through substantially zero impedance means, whereby closing of the switch will short-circuit the lines. Such device may also include other equipment which is not relevant to this invention.

Theoretically, connection of said switch to the lines and then closing it will make certain that if they have not already done so, all network protectors in circuit with the lines will trip, or secondary protection fuses will open, because of the short-circuiting of the lines. In practice, however, this does not always occur, and even though large short-circuit currents may not be involved, it has been found that, under some conditions and with certain types of switches, arcing has occurred when a switch of such type is re-opened which has caused fires and damage to the device and other adjacent equipment. Accordingly, it is hazardous to re-open such a switch when there is backfeed on the lines.

When the switch is closed, the voltage between the switch poles, between the lines adjacent thereto, and between the poles or lines and ground, is negligible even though there is backfeed, and depending upon the line, load and breaker conditions, the short-circuit currents may be as small as three-tenths of an ampere or as high as several thousand amperes. Accordingly, simple voltage or current measuring devices or relays are not practical for detection of backfeed because of the magnitude ranges of the voltages and currents and more complex measuring devices are undesirable because of their complexity and the need for at least three of them or three successive measurements.

One object of the invention is to provide a simple and reliable detecting apparatus which is especially useful in connection with a "ground and test" device for detecting and indicating the presence of current in any one or more of three lines, either balanced or unbalanced, after they have been short-circuited and which may be installed adjacent to the short-circuiting means.

Another object of the invention is to provide detecting and indicating apparatus of the aforementioned type which provides a visual and/or audible warning to an operator of the presence of current in one or more of said lines.

A further object of the invention is to provide such apparatus having means for preventing re-opening of the short-circuiting switch when a current is flowing in one or more of said lines.

The apparatus of the preferred embodiment of the invention includes three current transformers which may be magnetically coupled respectively to the three phase lines adjacent to a short-circuiting switch therefor, so that a current of as small as three-tenths of an ampere in one or more of the lines will provide an output from the transformer or transformers coupled to the current carrying line or lines sufficient to operate an alarm by way of suitable amplifying and rectifying means. The outputs of the transformers are connected to a combining transformer which provides an electrical output when there is current in one or more of the lines. The output of the combining transformer is amplified and rectified and, preferably, controls a pair of relays which, in turn, control visible and audible alarm devices and control the re-opening of the short-circuiting switch.

Other objects and advantages of the present invention will be apparent to those skilled in the art from the following description of presently preferred embodiments thereof, which description should be considered in conjunction with the accompanying drawings in which:

FIG. 1 is a simplified, schematic, electrical diagram of a known type of electrical power distribution system; and FIG. 2 is a simplified, schematic, electrical diagram of the apparatus of the invention connected to a portion of a known ground and test device.

The conventional electrical power distribution system illustrated in FIG. 1 comprises three phase, high voltage lines 1 and 2, normally at a voltage in excess of 69 kilovolts, connected through transformers 3 and 4 to bank breakers 5 and 6. The transformers 3 and 4 reduce the voltage to a lower voltage, such as, for example, to a voltage of approximately 13 kilovolts.

At the exit sides of the bank breakers 5 and 6, the breakers 5 and 6 are connected to feeder breakers 7–12 which may, for example, be located in a substation. Other apparatus which may be included in the substation and in the system illustrated has not been shown for ease in illustration and because such other apparatus is not essential to an understanding of the invention.

From each of the feeder breakers 7–12, feeder lines 13–18, each comprising at least three wires or lines, extend to other transformers, such as the network transformers 19–22, which further reduce the voltage to a lower voltage, such as, for example, to a voltage of 120/208 volts. The network transformers 19–22 are connected to the customer loads 23 and 24 through network protectors 25–28 which normally include both breakers and fuses. It will be observed that the exit sides of the network protectors 25 and 26 are interconnected at the load 23 and that the exit sides of the network protectors 27 and 28 are interconnected at the load 24.

Assume that a fault occurs at the portion 29 of the feeder line 13. Normally, with such a fault, the feeder breakers 7 and the network protectors 25 and 27 will open automatically causing the feeder line 13 to be free of voltage. Normally, the protectors 25 and 27 will open because of reverse current flow from the feeder 18 to the fault at 29 and the network protectors 26 and 28 and others, may also open automatically if the current flow to the fault at 29 is sufficient to open them. If the breakers and network protectors function properly, the feeder line 13 will be free of voltage, and such condition may be indicated by the fact that neon lamps (not shown) associated with the feeder line 13 will extinguish, thereby indicating to the station operator that there is no backfeed to the feeder line 13 from the system load. With this condition no problem exists, and the operator will connect the ground and test device to the feeder line 13 and ground the feeder line by closing a switch hereinafter described. The ground and test device may then be used to test the feeder line 13 to determine the location of the fault. This testing is done after the test device probes are inserted into the test device and the test device contacts are opened.

However, in unusual circumstances, the breakers and network protectors may not open automatically leaving a voltage on the line 13 due to backfeed. This condition may be noted by observing said neon lamps. It is customary to take certain steps when the condition is noted, but a description of such steps is not necessary to an understanding of the invention. The condition of the feeder breakers 7 may be visually inspected at the substation so as to make certain that the feeder line 13 has been disconnected from the exit side of the bank breakers 5. On the other hand, the network protectors 25-28 normally will be located remotely from the substation, and it is difficult and time consuming to make a visual inspection of all such network protectors. Furthermore, even a visual inspection can be deceiving in that, for one reason or another, a circuit may be completed through a breaker even though it appears to be open.

Accordingly, it is the normal practice, at least for one utility company, to ground the individual lines of the feeder line 13 at the substation through means having negligible impedance prior to attempting to perform tests or work on the line 13 after a fault, such as the fault at 29, has occurred. It would be expected that by grounding the line 13 at the substation, any network protectors in circuit with the line 13 which have not already opened automatically will open when the line 13 is grounded because of the negligible impedance interconnection of the individual lines, forming part of the feeder line 13, at the substation even if the fault at 29 is not sufficient to open such network protectors. Thus, if the relevant network protectors have not opened and the line 13 is still electrically connected to the line 18 (so-called "backfeed", when the lines of the line 13 are interconnected and connected to ground, heavy currents should flow through the relevant network protectors so that either the breakers or fuses thereof should open. However, if the network protectors do not open even under those conditions, which has happened, it has been found that when the grounding and interconnecting switch, of the type used in some ground and test devices, is subsequently opened, arcing occurs at the switch which has, at various times, caused fire and damage to the equipment at the substation. It is, therefore, highly desirable to be able to determine whether or not the line 13 is "live" after the lines thereof have been interconnected and grounded.

The apparatus of the invention illustrated in FIG. 2 provides an indication of the conditions of the individual lines 30-32 forming part of a feeder line, such as the line 13, when the lines 30-32 are interconnected, so that, if necessary, an operator may take steps to isolate the line 13, such as by inspecting the network protectors 25-28 prior to interrupting the connection between such lines 30-32. The "ground and test" device hereinbefore-mentioned includes a three-pole switch 33 which is manually connected at one side to the lines 30-32 and connected at the opposite side to ground through heavy copper conductors 34-36, which have negligible impedance. The connection of the lines 30-32 to the switch 33 is made prior to closing the switch 33, and after the connections have been made, the switch 33 is closed, which not only interconnects the lines 30-32 with a negligible impedance therebetween, but also connects such lines to ground through a negligible impedance. Thus, when the switch 33 is closed, an overload current should flow in the lines 30-32 causing appropriate network protectors, such as the network protectors 25-28, to open. However, as mentioned, it sometimes occurs that the appropriate breakers or fuses of the network protectors do not open or blow, so that if the switch 33 is thereafter opened, heavy arcing will occur at the terminals of the switch 33 which may cause the damage described hereinbefore. Because of the nature of the impedances between the switch 33 and the source of the backfeed, the current which flows in the lines 30-32 when the switch 33 is closed may not always be large. For example, there is electrical impedance between the lines supplying the backfeed and the lines to be short-circuited to ground by the switch 33, and if such impedance is relatively high, the current in the affected line or lines 30-32 may be relatively small. It is not necessary that the current be excessive when the switch 33 is closed in order to produce heavy arcing at the switch 33 when it is re-opened, and when one or more of the lines 30-32 is "live".

The detecting and indicating apparatus of the invention comprises three current transformers 37-39, each respectively having a core 40, 41 or 42 and a coil 43, 44 or 45. The transformers 37-39 are magnetically coupled to the lines 30-32, the transformer 37 being coupled to the line 30, the transformer 38 being coupled to the line 31, and the transformer 39 being coupled to the line 32. Although the transformers 37-39 are coupled to the lines 30-32 adjacent to the high side of the switch 33, they may also be coupled to the lines 30-32 by having their cores 40-42 extending around the conductors 34-36.

Preferably, the current transformers 37-39 are separate from any other current transformers which may be present in the ground and test device for other purposes in order to make certain that the output current of the transformers 37-39 correctly reflects the presence of current in one or more of the lines 30-32. In some cases, current transformers already present in the ground and test device may be connected to other circuits and provide an output current even though no current is flowing in any of the lines 30-32. However, if the latter current transformers provide an output current only when current is flowing in the corresponding lines 30-32 or if the output current thereof when no current is flowing in the lines 30-32 is compensated for, such already present transformers may be used as the transformers 37–39.

Whenever there is current flowing in any one of the lines 30–32, an alternating current and voltage will be produced at the coil of the transformer coupled to the line in which alternating current is flowing. Thus, if the alternating current is flowing in the line 30 after the switch 33 is closed, an alternating current and voltage will be produced at the coil 43. The coils 43–45 are connected to combining means in the form of a further current transformer 46 which has an output winding 47 and a further winding 48 for the purposes described hereinafter. The transformer 46 may, for example, be a current transformer of the type sold by Harvey Hubbel, Inc., Bridgeport, Connecticut, as part No. D-51147-01.

If the coils 43–45 were all connected to the input of the transformer 46 with the same polarity, there would be an output voltage at the winding 47 when the currents flowing in the lines 30–32 are unequal, e.g., current flowing in one or two lines and not in the remaining lines, or flowing in all lines but being of unequal magnitude. However, if the currents flowing in the lines 30–32 are equal, the net voltage at the winding 47 would be substantially zero because of the current phase relationships. Accordingly, two of the coils 43–45 are connected to the transformer 46 with the same polarity and one of the coils 43–45 is connected to the transformer 46 with the opposite polarity, FIG. 2 showing coil 45 connected to the transformer 46 in a polarity opposite to that of the coils 43 and 44. With these connections, a voltage will be produced at the winding 47 if current is flowing in one or more of the lines 30–32 and regardless of the magnitudes thereof.

The winding 47 is connected to a conventional amplifier 49 suitable for amplifying currents of the frequency of the voltage on the lines 30–32 and the amplifier 49 is connected to a conventional rectifier 50 which converts the alternating current output of the amplifier 49 into a direct current suitable for operating control means in the form of a relay 51. Preferably, the amplifier 49 comprises an integrated circuit, operational amplifier of the type sold by Fairchild Camera & Instrument Co., Mountain View, California, under the type No. 741TC and is energized with direct current.

The relay 51 has an armature 52 which completes a circuit for energizing further control means in the form of a relay 53 having armatures 54 and 55. Although it is preferred to have a separate relay 53 energizable by a relay 51, a single relay 51 with armatures 54 and 55, as well as the armature 52 operable thereby, may be employed. Although it is preferred to amplify the output of the transformer 46 and then convert the amplified signal to direct current for operating the relay 51, other methods and apparatus for utilizing the output of the transformer 46 will be apparent to those skilled in the art and may be used for the purposes hereinafter described.

Accordingly, when there is current flowing in a line 30, 31 or 32 or in any number of such lines after the switch 33 is closed, the relay 51 is energized causing energization of the relay 53. When the relay 53 is de-energized, the armature 55 completes an obvious circuit for energizing a lamp 56 which may, for example, be a lamp of green color, and the armature 55 opens an obvious circuit for energization of a second lamp 57 which may, for example, be of red color. When the relay 53 is energized, it causes the lamp 56 to extinguish and causes energization of the lamp 57 by way of the armature 55.

Accordingly, when there is no current flowing in the lines 30, 31 or 32, the green lamp 56 is energized and the red lamp 57 is de-energized. Conversely, when current is flowing in one of the lines 30–32, the red lamp 57 is energized and the green lamp 56 is de-energized.

The apparatus of the invention may be provided with a conventional audible alarm 58, such as a buzzer or bell, but preferably, is an audible alarm unit sold by Mallory Battery Co., Tarrytown, New York, under Model No. SC110P. The alarm 58 is selectively connectable by means of a switch 59 so as to be energized either when current is not flowing in the lines 30–32 or when current is flowing in one of the lines 30–32. The purpose of such optional connection will be described hereinafter.

In the preferred embodiment of the invention, the switch 33 is openable only by means of energization of energizable means in the form of a trip solenoid 60 which is connectable to an energizing source by means of a circuit including the armature 54 and a manually operable switch 61. Thus, when the relay 53 is de-energized, the switch 33 may be opened by pressing the switch 61, but if the relay 53 is energized, pressing of the switch 61 does not complete the energizing circuit for the solenoid 60 and, therefore, does not cause opening of the switch 33.

It will be apparent from the foregoing description that if the detection circuit is inoperative from the transformer 46 through the circuits, including the indicating devices 56, 57 and 58, a warning will not be given to an operator if current is flowing in one of the lines 30–32 when the switch 33 is closed. Accordingly, for testing purposes the apparatus of the invention preferably is provided with an alternating current generator 62, the output of which preferably has a frequency which is the same as that of the frequency of the currents in the feeder lines 30–32. Preferably, the generator 62 comprises an integrated circuit timer of the type sold by Raytheon Co., Mountain View, California, under type No. RC555DN suitably connected to act as a signal generator. The generator 62 is energizable by means of a manually operable switch 63 and is connected to the winding 48 so that when the switch 63 is closed, a test signal is provided to the transformer 46 which produces a voltage at the winding 47 which simulates a voltage appearing on the winding 47 because of current flowing in one of the lines 30–32. Accordingly, when the switch 63 is pressed, the red lamp 57 will be energized and if the switch 59 for the audible alarm 58 is in the position shown in FIG. 2, the audible alarm 58 will be energized.

The operation of the apparatus of the invention is as follows:

(1) With the switch 33 open, its high side terminals are connected to the lines 30–32. At this point the green lamp 56 will be energized whether the lines 30–32 are "live" or not.

(2) The switch 63 is closed, and if the circuits from the transformer 46 to the indicating devices are working properly, the green lamp 56 will extinguish, the red lamp 57 will illuminate and the alarm 58 will sound until the switch 63 is opened.

(3) The switch 33 is closed and will remain closed until the trip solenoid 60 is energized. If one or more of the lines 30–32 is "live", the green lamp 56 will extinguish, the red lamp 57 will illuminate, the alarm 58 will sound and the trip solenoid 60 energizing circuit will be opened by the armature 54. If the green lamp 56 remains lit, the operator knows that none of the lines 30–32 is "live", and the switch 61 may be closed to open the switch 33.

(4) If the alarm 58 is sounding, the operator may throw the switch 59 to silence the alarm 58.

(5) If the lines 30–32 all cease to be "live" either by reason of opening of fuses or network protector breakers in circuit therewith, or by reason of remedial action taken by the field operator, the green lamp 56 illuminates, the red lamp 57 extinguishes, the alarm 58 sounds if the station operator previously moved the switch 59 to its left position and the circuit for energization of the trip solenoid 60 is completed by the armature 54.

(6) The station operator then knows that the lines 30–32 are no longer "live" and may then open the switch 33 by closing the switch 61.

Apparatus of the invention is able to detect current flow in any one of the lines 30–32 as small as three-tenths of an ampere and remains operative even when the current flow is as large as 3,000 amperes. Therefore, it is highly sensitive and neither sustains damage nor requires adjustment when used under the conditions which may be encountered in the use thereof described. Furthermore, it detects a "live" line in any one of three lines, including lines carrying three phase current, without any need to transfer connections between such lines. Also, it is not necessary to attempt to measure the very low voltages present adjacent the switch 33 when it is closed, and the apparatus can withstand the high voltages present when the switch 33 is open and one or more of the lines 30–32 is "live" by reason of backfeed or other causes.

Although preferred embodiments of the present invention have been illustrated and described, it will be apparent to those skilled in the art that various modifications may be made without departing from the principles of the invention.

What is claimed is:

1. Apparatus for detecting, in a three wire, alternating current electrical system having three lines which normally are at different voltages at any given instant but having the three lines connected together by short-circuiting means of negligible impedance, the current flow in any one of said lines adjacent to said short-circuiting means, said apparatus comprising:
    coupling means including three transformers which may be magnetically each coupled to a respective one of said lines adjacent said short-circuiting means for providing an alternating current output whenever alternating current flows in any of said lines;
    combining means having an input and an output and having its input connected to said transformers for combining the alternating current output of the latter and providing an alternating voltage at its output whenever there is alternating current flowing in any of said lines; and
    indicating means connected to said output of said combining means and responsive to an alternating voltage at said output.

2. Apparatus as set forth in claim 1, wherein said short-circuiting means comprises a switch for interconnecting said lines and wherein said transformers are current transformers, each having core means for the passage of one of said lines therethrough.

3. Apparatus as set forth in claim 1, wherein said indicating means comprises alarm means.

4. Apparatus as set forth in claim 3, wherein said alarm means comprises a light source energized by the presence of a voltage at the output of said combining means.

5. Apparatus as set forth in claim 3, wherein said alarm means comprises an audible signal generator energized by the presence of a voltage at the output of said combining means.

6. In a three wire, alternating current electrical system having three lines which normally are at different voltages at any given instant, testing and detecting apparatus comprising:
    switch means for interconnecting said lines with negligible impedance therebetween;
    three current transformers magnetically coupled to said lines at portions thereof which are adjacent said switch and which are substantially the same voltage as the voltage on said switch, one transformer being coupled to each line, for providing an alternating voltage after said switch is closed and current flows in the line to which a transformer is coupled;
    voltage responsive means connected to said transformers for providing an output after said switch is closed and said alternating voltage is provided by at least one of said transformers; and
    indicating means connected to said voltage responsive means and responsive to said output thereof whenever it is present.

7. Apparatus as set forth in claim 6, wherein said indicating means comprises alarm means.

8. In a three wire, alternating current electrical system having three lines which normally are at different voltages at any given instant, testing and detecting apparatus comprising:
    switch means for interconnecting said lines with negligible impedance therebetween, said switch means comprising energizable means for opening said switch means and thereby disconnecting said lines from each other;
    three current transformers magnetically coupled to said lines adjacent said switch, one transformer being coupled to each line, for providing an alternating voltage when current flows in the line to which a transformer is coupled;
    voltage responsive means connected to said transformers for providing an output when said alternating voltage is provided by at least one of said transformers; and
    circuit means for energizing said energizable means including control means connected to said voltage responsive means for preventing energization of said energizable means and thereby preventing opening of said switch when said voltage responsive means provides said output.

9. Testing and detecting apparatus as set forth in claim 8, wherein said energizable means is a solenoid and said control means comprises a relay connected to said voltage responsive means.

10. Apparatus for detecting, in a three wire, three phase, alternating current electrical system having three lines, one for each phase, which normally are at different voltages at any given instant but having a switch of negligible impedance for interconnecting said lines, the current flow in any one of said lines adjacent to said short-circuiting means, said apparatus comprising:
    coupling means including three current transformers each having core means for the passage of one of said lines therethrough adjacent said switch for providing an alternating current output when alternating current flows in any of said lines;

combining means comprising a further transformer having three inputs and an output and means connecting a first one of said inputs to a first one of said three transformers, a second one of said inputs to a second one of said three transformers with the same polarity as said first one of said inputs and connecting the third one of said inputs to the remaining one of said three transformers with a polarity opposite to that of the first and second inputs for combining the alternating current output of said three transformers and providing an alternating voltage at its output; and indicating means connected to said output of said combining means and responsive to an alternating voltage at said output.

11. Apparatus for detecting, in a three wire, alternating current electrical system having three lines which normally are at different voltages at any given instant but having the three lines connected together by a switch of negligible impedance, the current flow in any one of said lines adjacent to said short-circuiting means, said switch having energizable means for opening said switch and circuit means for energizing said energizable means, said apparatus comprising:

coupling means including three transformers which may be magnetically each coupled to a respective one of said lines adjacent said switch for providing an alternating current output when alternating current flows in any of said lines;

combining means having an input and an output and having its input connected to said transformers for combining the alternating current output of the latter and providing an alternating voltage at its output; and indicating means connected to said output of said combining means and responsive to an alternating voltage at said output, said indicating means comprising control means responsive to the presence of a voltage at the output of said combining means and further comprising means for interconnecting said control means and said circuit means for preventing opening of said switch when a voltage is present at the output of said combining means.

12. In a three wire, three phase, alternating current electrical system having three lines, one for each phase, which normally are at different voltages at any given instant, testing and detecting apparatus conprising:

switch means for interconnecting said lines with negligible impedance therebetween;

three current transformers magnetically coupled to said lines adjacent said switch, one transformer being coupled to each line, for providing an alternating voltage when current flows in the line to which a transformer is coupled;

voltage responsive means comprising a further transformer having three inputs and an output and means connecting a first one of said inputs to a first one of said three transformers, a second one of said inputs to a second one of said three transformers with the same polarity as said first one of said inputs and connecting the third one of said inputs to the remaining one of said three transformers with a polarity opposite to that of the first and second inputs for providing an output when said alternating voltage is provided by at least one of said current transformers; and indicating means connected to said voltage responsive means and responsive to said output thereof.

13. In a three wire, alternating current electrical system having three lines which normally are at different voltages at any given instant, testing and detecting apparatus comprising:

switch means for interconnecting said lines with negligible impedance therebetween, said switch means comprising energizable means for opening said switch means for disconnecting said lines from each other and circuit means for energizing said energizable means;

three current transformers magnetically coupled to said lines adjacent said switch, one transformer being coupled to each line, for providing an alternating voltage when current flows in the line to which a transformer is coupled;

voltage responsive means connected to said transformers for providing an output when said alternating voltage is provided by at least one of said transformers;

indicating means connected to said voltage responsive means and responsive to said output thereof; and control means responsive to said output of said voltage responsive means and connected to said circuit means for preventing opening of said switch means when said voltage responsive means provides said output.

* * * * *